United States Patent [19]

Jacobs et al.

[11] 4,134,137

[45] Jan. 9, 1979

[54] SINGLE WIRE MICROELECTROMETER IMAGING SYSTEM

[75] Inventors: Paul F. Jacobs, Pasadena; Thomas L. Thourson, Clairemont; Robert C. Speiser, Altadena, all of Calif.

[73] Assignee: Xerox Corporation, Stamford, Conn.

[21] Appl. No.: 737,236

[22] Filed: Nov. 1, 1976

[51] Int. Cl.² .............................................. H04N 1/10
[52] U.S. Cl. ................................ 358/293; 324/76 R; 324/123 R; 358/111; 358/295
[58] Field of Search ............... 358/294, 295, 293, 111; 324/76 R, 109, 123 R

[56] References Cited

U.S. PATENT DOCUMENTS

| 2,830,114 | 4/1958 | Carlson | 358/294 |
|---|---|---|---|
| 3,255,308 | 6/1966 | Walkup | 358/294 |
| 3,256,481 | 6/1966 | Pulvari | 324/109 |
| 3,257,506 | 6/1966 | Siepmann | 358/169 |
| 3,404,341 | 10/1968 | Young | 324/109 |
| 3,742,125 | 6/1973 | Siegel | 358/81 |
| 3,824,399 | 7/1974 | Bjork | 250/320 |
| 4,019,052 | 4/1977 | Haas | 250/315 A |
| 4,028,726 | 6/1977 | Argy | 358/180 |

*Primary Examiner*—Howard W. Britton
*Attorney, Agent, or Firm*—Irving Keschner

[57] ABSTRACT

A single wire microelectrometer imaging system is disclosed wherein a latent electrostatic image charge pattern is produced, then measured from point to point across the charged image surface and then transmitted for processing if desired. It is found that this system provides multiple image information from a single exposure which is especially significant in xeroradiographic medical diagnostic imaging processes. Thus instead of developing a latent electrostatic image which is produced the charge is captured and transmitted, to be stored or further processed if desired. The captured image may be shown in either hard copy form or on a video screen as desired.

9 Claims, 7 Drawing Figures

SINGLE WIRE MICROELECTROMETER IMAGING SYSTEM

BACKGROUND OF THE INVENTION

This invention relates to electrostatography and more specifically to method and means for processing charged image patterns. A charged image pattern which directly corresponds to an image is referred to as a latent electrostatic image. This latent electrostatic image may be stored on an insulator or a photoreceptor and may be formed either by placing a charged pattern on a dielectric as for example by writing with an electron gun in a vacuum or charging through a stencil or alternatively may be formed by classical xerographic techniques, i.e., charging a photoreceptor and selectively exposing same or by electroradiographic techniques including xeroradiography, ionography and electronradiography. Subsequent processing in these techniques commonly called development has heretofore been accomplished generally by deposition of pigmented marking material referred to as toner or developer employing conventional powder cloud, magnetic brush, cascade, or liquid development systems among others with or without a transfer process as required to provide an optical image in hard copy form on a suitable substrate when desired.

Generally speaking whatever development system is employed there are inherent problems experienced in loss of information, sensitivity limitations, image characteristics fixed per exposure, and image noise or granularity added by discrete nature of toner particles. These problems generally arise by virtue of the characteristics of the toner such as size, pigmentation and pigment-to-charge ratio and characteristics of the electrical and mechanical configuration of the development system.

More specifically in the well known enhancement of xerography there occurs partial loss of broad area information by supression in the development process. It is therefore found that development of the electrostatic image signal is generally less than complete, representing a loss in sensitivity in accordance with the limitations of the pigment deposited per charge neutralized, i.e., the pigment/charge ratio. For these systems in which many exposure photons are required to produce image charge equivalent to one toner particle, the image quality or signal-to-noise ratio and/or sensitivity is decreased which necessitates higher exposure. Finally, toner development of the image generally involves loss or degradation of the latent charge image so that development of an alternate hard copy optical image via a different development system characteristics may involve another exposure and latent charge image generation step.

In xeroradiographic imaging applications an X-ray image is formed on a selenium alloy photoreceptor by exposure of X-ray radiation through a object onto said photoreceptor, said charged photoreceptor resulting in an electrostatic charge pattern. This latent image is developed directly on the photoreceptor employing powder cloud development and is then transferred to paper, fused, and results in an edge enhanced image on a hard copy for a physcian to diagnose. When degradation of the latent image information occurs during development, transfer, and/or fusing, obvious concerns arise with regard to the loss of medical diagnostic information. Furthermore, it is found in these processes that photoreceptor life is limited by the repeated brush cleaning of the untransferred developer or toner. It should be noted, in addition, that this type of X-ray technique is also used in various and sundry commercial applications such as discerning defects in casting wells or the like, etc. Thus, although powder cloud development is an inexpensive, effecient method of providing edge enhanced images it is found not to provide emphasis of density ranges and therefore to have a limited latitude in usage.

Thus it is an object of this invention to provide an imaging system which is devoid of the above noted deficiencies.

Still another object of this invention is to provide an imaging system which preserves the integrity of the latent electrostatic image.

Yet another object of this invention is to provide a novel imaging system.

Again another object of this invention is to provide an imaging system which processes the electrostatic charge pattern so that it may be effectively utilized in desired applications.

Yet still another object of this invention is to provide an imaging system which eliminates conventional development systems and their inherent disadvantages.

It is a further object of this invention to provide an imaging system which effectively preserves, utilizes and processes electrostatic charge patterns.

Still another object of this invention is to provide a novel imaging system which may store a charged electrostatic charge pattern, retrieve it and transmit it as desired.

Another object of this invention is to provide a system to which conventional image processing can be applied.

These and other objects of the instant invention are accomplished, generally speaking, by providing an imaging system wherein a latent electrostatic charge image is provided, e.g., on a photoconductor or on an insulating surface, capable of bearing a charge image, the image is then scanned with an electrometer type device to detect the magnitude of the induced charge at each point on the surface, the resulting electrical signal is transmitted through appropriate devices so that the signal may be processed as desired to produce visible images on video monitors or on hard copy devices. These images may exhibit contrast stretching, magnification, pseudo color or other typical image processing features. Further, the image information in electrical form may be transmitted to remote locations or stored in suitable memories for later utilization.

More specifically a charge pattern is formed on a dielectric or photoconductor as desired as, for example, in electrophotographic or xeroradiographic applications where a photoconductor is uniformly charged and then selectively exposed to provide the resultant latent electrostatic image which is then captured by any suitable means, for example, by employing either a single wire microelectrometer or a multiple wire microelectrometer which senses, measures, and transmits accurately the electrostatic pattern to a processing media. The term "capture" hereinabove recited describes the process of sensing and measuring the magnitude of an induced charge as described above.

This charge capture of the latent electrostatic image is accomplished with minimal noise added to the signal-to-noise ratio inherent in the latent electrostatic charge image so that it presents several alternatives for processing. The charge image may be read as analog signals to a video screen processed as such with a suitable contrast gain applied as a function of the signal level to provide a video image of selectable brightness and contrast. Alternatively, the analog signal can be used to generate a hard copy using a suitable device.

Secondly, the charge image can be stored in analog or digital form by various means and processed in various methods including high or low spatial frequency suppression, contrast stretching, clean-up of structured "noise" (not statistical noise), and then displayed on video or made into hard copy. In this case, once stored, the captured latent charge image signals can be alternately processed in different ways to provide several images of different characteristics as desired from the single original exposure.

In addition, any types of operations with image information as presently accomplished, pursued or proposed which are captured by optical methods could be used with this approach with the advantage of not having degraded the latent electrostatic image by a prior conventional development.

Further computer analysis of image information can be readily made, for example, via Fourier or textural analyses to detect or suppress certain size or structure image formation.

This approach can produce, from a single exposure, multiple images each of which has a distinctly different character. The multiple images may emphasize and display different types of information more effectively than a single image.

For example, in radiography, images exhibiting high spatial frequencies better display fine structure such as small calcifications in tissue, whereas images exhibiting low spatial frequencies better display broad area structure such as metastatic bone cancer. This can presently be done by connecting the image information in a film radiograph or a xeroradiograph to an electrical signal by optical scanning. However, whatever development system is used to obtain the radiograph imparts a quality to the image which limits subsequent processing as hereinbefore described.

More specifically in employing a scanning electrometer system, for example, for capturing and displaying latent electrostatic image information the following advantages are realized:

(1) The image is not degraded by development nonuniformities, edge enhancement, transfer, or fusing as, for example, in conventional xerographic development systems.

(2) Physical contact with the photoreceptor is eliminated and accordingly photoreceptor life is increased.

(3) The system can operate effectively at very low X-ray exposures.

(4) The system provides for the selection of the type and amount of edge enhancement during processing that may be desired to most effectively display the image information.

(5) Various image features may be emphasized by adjusting the density and contrast of the displayed image to emphasize the information or diagnosis desired, especially in medical diagnostic techniques.

(6) From single X-ray exposure, multiple images can be obtained exhibiting different characteristics to best display the different types of information. Thus, more information is readily extracted with minimal exposure of the patient to radiation.

(7) Pseudo color can be added for emphasis of image details in accordance with conventional techniques.

(8) Other techniques of image processing could be applied to the instant invention by those skilled in the art.

One embodiment of the instant invention uses a single wire microelectrometer. This consists of a wire with cross section area of approximately the same size as the smallest picture element to be resolved. The wire is connected to a field effect transistor which has high input resistance. The output of the field effect transistor is connected to an amplifier to further amplify the signal. When the wire of the microelectrometer is placed in close proximity to the latent charge image, a charge is induced on the wire with a magnitude which is proportional to the charge in the picture element. In turn, the output of the amplifier is proportional to the induced charge. To capture an image, the microelectrometer is scanned across the image bearing surface. The result is a time varying signal from the amplifier which represents the spatial variation of charge along the line of the scan. By repeated scanning in this fashion, the entire two dimensional image is captured and transformed into electrical signals.

The magnitude of the induced signal on the microelectrometer wire is determined, not only by the charge in the picture element, but also by the capacitance between the picture element and the wire.

The gap capacitance is a function of the shape of the wire and the distance between the wire and the surface. Therefore, it is important to either maintain a precise spacing between the wire and the surface or to measure the spacing at each point and make appropriate corrections to the signal amplitude. For example, the gap may be maintained with an air bearing providing the undulations in the image bearing surface are not too large or abrupt. Alternatively, the electrometer may be rigidly fixed and the distance sensed by optical techniques, etc.

Care should be taken to design the electronic circuitry to control leakage of charge from the probe to ground to avoid adding noise to the system. Care should also be taken to design the circuit and choose components to minimize fluctuation in performance with temperature variation.

Photoreceptors are subject to dark decay. Since the scan requires a finite length of time, the photoreceptor material should be selected to minimize dark decay so that the signal truly represents the latent electrostatic image. In the event that dark decay is not acceptable at desirable scan rates, this deleterious effect can be mitigated by providing means to measure the dark decay and compensate electronically.

In another embodiment of the system of the instant invention, a multiple probe electrometer array is employed comprising a number of single probe electrometers which are mechanically coupled such that more than one path of readings are taken with one scan across the latent image. The more electrometers which are employed, the less number of scans are required to do a complete raster scan. Increasing the number of probes increases the electronics and gap maintenance complexity while it reduces the mechanics, image interlace complexities and processing time.

The general premise of the instant invention having been discussed and understood, the specifics of the system of the instant invention will be more clearly understood with reference to the drawings of which.

Figure 1:
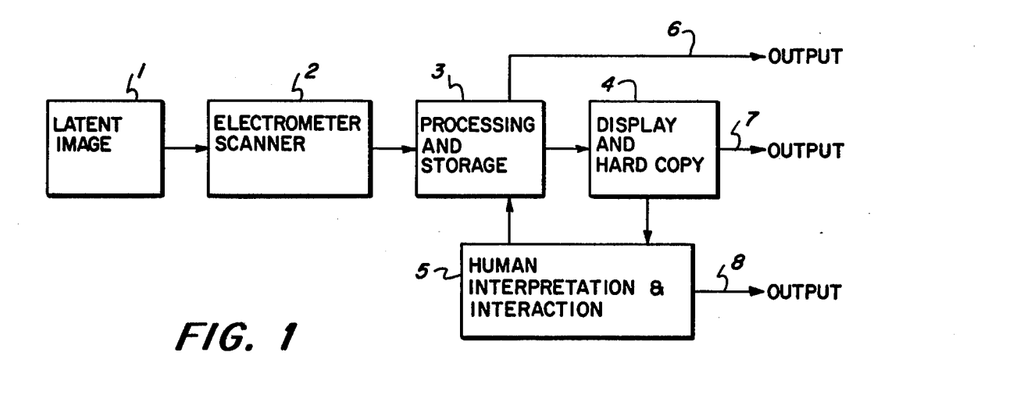
FIG. 1 is one embodiment of the overall system of the instant invention.

In FIG. 1 is seen the general system of the instant invention which may employ single and/or multiple probe electrometers with a number of analog digital or hybrid system configurations. A charge pattern image 1, which may reside on a selenium photoreceptor which has been charged and selectively exposed to produce the resulting latent electrostatic image is scanned by scanning system 2 which is transmitted to processing and storage 3. The scanning system may be a reading device which is caused to move across the charged latent electrostatic image surface until the entire surface is scanned. Thereafter it is seen that the captured signal may take one of three approaches 6, 7 or 8. 6 represents a digital or analog recording of the original signal or processed signal; 7 represents the output of a soft display or an opaque or transparency hard copy 4 and, 8 represents the output of the observer interpretation 5 of the image information on the display and the capability to manipulate the display through the processing system 3 to maximize his ability to extract information.

The storage in module 3 for an analog system can employ a scan converter, video disc or a shift register, for example, a charge coupled device. For a digital system, storage can consist of a magnetic tape, magnetic disc, core or semiconductor memory. Accordingly, the output 6 corresponds to the storage media used.

Processing can include contrast stretching, magnification, edge enhancement, psuedo color, etc.

The soft copy display in 7 may be a video monitor. The hard copy display may be photographic image of a video display or it may be an image created by a device which takes an incoming signal and converts it to a visible image by any one of several scanning devices. These may be optical, electrical, mechanical or chemical in nature.

By way of illustration in a xeroradiographic medical diagnostic mode, the latent image 1 can be formed by uniformly charging a photoreceptor and then exposing said charged photoreceptor to X-rays which have been transmitted through the body part being examined. The latent image can be captured and transformed to electric signals by scanning uniformly charging a photoreceptor and then exposing said charged photoreceptor to X-rays which have been transmitted through the body part being examined. The latent image can be captured and transformed to electric signals by scanning the latent image on the photoreceptor with the electrometer scanner 2 hereinafter described. The electric signal can be processed, for example, so that the image will exhibit enhanced contrast. The processed signal can be transmitted to a video monitor 4 to produce a visual image 7 which may be examined by the operator.

Figure 2:
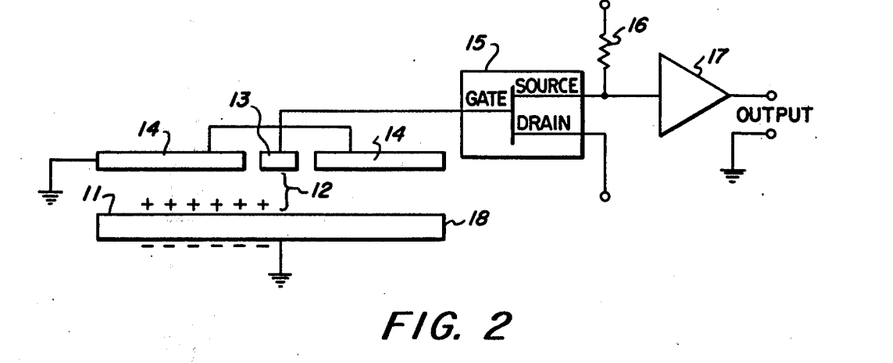
FIG. 2 is illustrative of an embodiment of the system of the instant invention which employs a single wire microelectrometer.

In FIG. 2 a single probe microelectrometer system is shown in cross section wherein a latent electrostatic image 11 resides on an image bearing surface 18. A gap 12 is maintained between the image bearing surface 18 and a probe 13 having a guard 14 which is grounded. The probe and ground captures the latent electrostatic charge image 11, by scanning the surface of the photoreceptor 18. A field effect transistor 15, an output resistor 16 and an amplifier 17 are operatively associated with said capture device in order to amplify and transmit same to a processing unit not shown.

Figure 3:
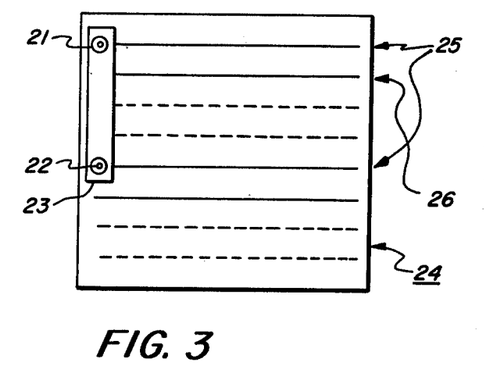
FIG. 3 is illustrative of another embodiment of the instant invention employing a multiple array microelectrometer system.

In FIG. 3 two single probe electrometers 21 and 22 are shown in a plan view mechanically coupled by a rigid mount 23 holding the electrometers such that more than one path of readings are taken with one scan across the latent image 24. In FIG. 3 are seen eight lines which are to be scanned which would require eight scans if done with one electrometer, but in this case since two electrometers are employed four scans are required. A first scan 25 is performed which reads the charge along the scan lines traced by electrometer 21 and 22. The electrometer assembly is then advanced one scan line and a second scan 26 is performed along the lines indicated, and so on. As previously indicated increasing the number of probes increases the electronics and gap maintenance complexity involved while it reduces the mechanics, image interlace complexities and processing time. Interlace problems occur when there is a mechanical fluctuation in the position from one scan line to the next. This arrangement involves the difficulty of fabricating close spaced probes and possible probe-to-probe coupling errors.

Figure 4:
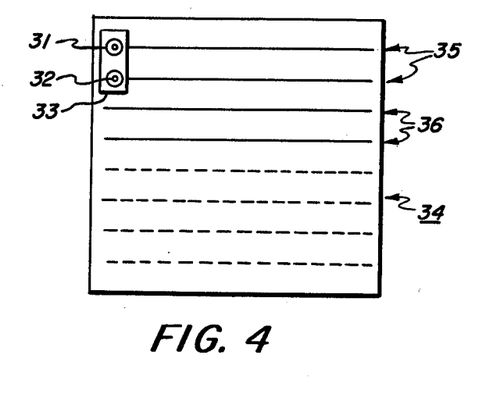
FIG. 4 is illustrative of yet another embodiment of the instant invention employing another multiple array microelectrometer system.

In FIG. 4 is seen a close spaced probe scanning technique having the same mechanical simplicity advantages and electronic complexity disadvantages as seen in FIG. 3. Electrometers 31 and 32 are again rigidly mounted by mount 33 in such a configuration as to scan two immediately succeeding lines on a first scan 35 and the next two successive lines in the second scan 36 of latent image 34. An additional advantage of this configuration is a reduced number of interlace locations when reconstructing the image.

If eight electrometers are employed only one scan would be required in order to scan the documents as seen in FIGS. 3 and 4. This single pass technique would eliminate the image interlace problems when reconstructing the image. It is therefore seen that in an actual system a single probe may be used to scan an image in successive scans or a multiprobe may be used to scan the entire image scan line in a single scan. For example if a latent image required 1024 lines to achieve the desired resolution the number of electrometer probes could be from 1 to 1024.

Figure 5:
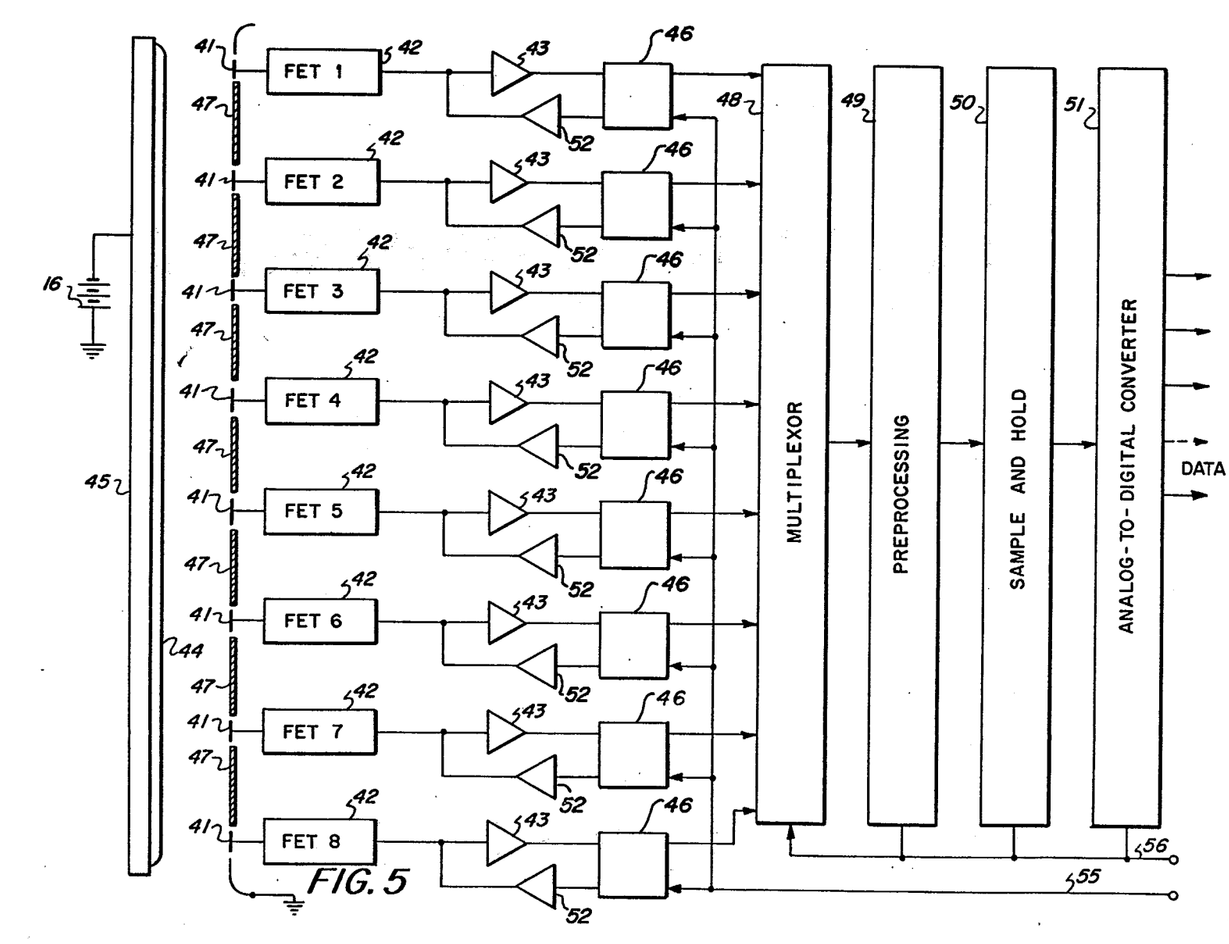
In FIG. 5 is illustrated a multiple electrometer head block diagram.

In FIG. 5 is seen an eight probe assembly which consists of a number of electrometers including eight probes 41 in operative association with eight FETs 24 and amplifiers 43. An automatic zeroing 46 (activated by a signal on lead 55) in conjunction with amplifier 52 and a clock signal applied to lead 56 are provided to make the appropriate adjustments as required. The electrometer assembly scans the surface of a selenium photoreceptor 44 residing on a substrate 45 having a back bias applied 46. The probes 41 are shielded by a shield 47. Thereafter the scanned signal is transmitted to a multiplexor 48, then to a preprocessor 49, a sample and hold circuit 50 and an analog-to-digital converter 51.

It is seen in this embodiment how multiplexing enables the electrometers to share preprocessing, sample and hold, and analog-to-digital conversion functions if they are desired for the particular application. In addition shared cabling reduces the mass of the head and increases the cable flexibility which provides for a more easily designed air bearing which provides the gap maintenance.

Figure 6:
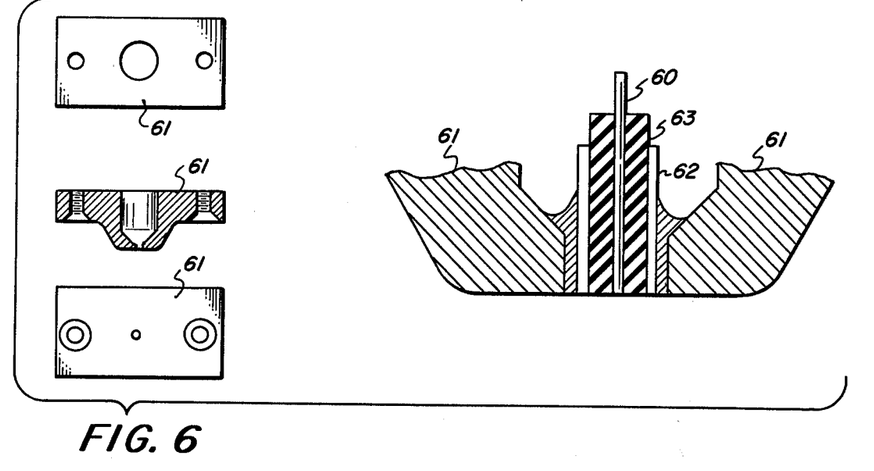
In FIGS. 6 and 7 there are seen examples of the single wire microelectrometer of the instant invention.
Figure 7:
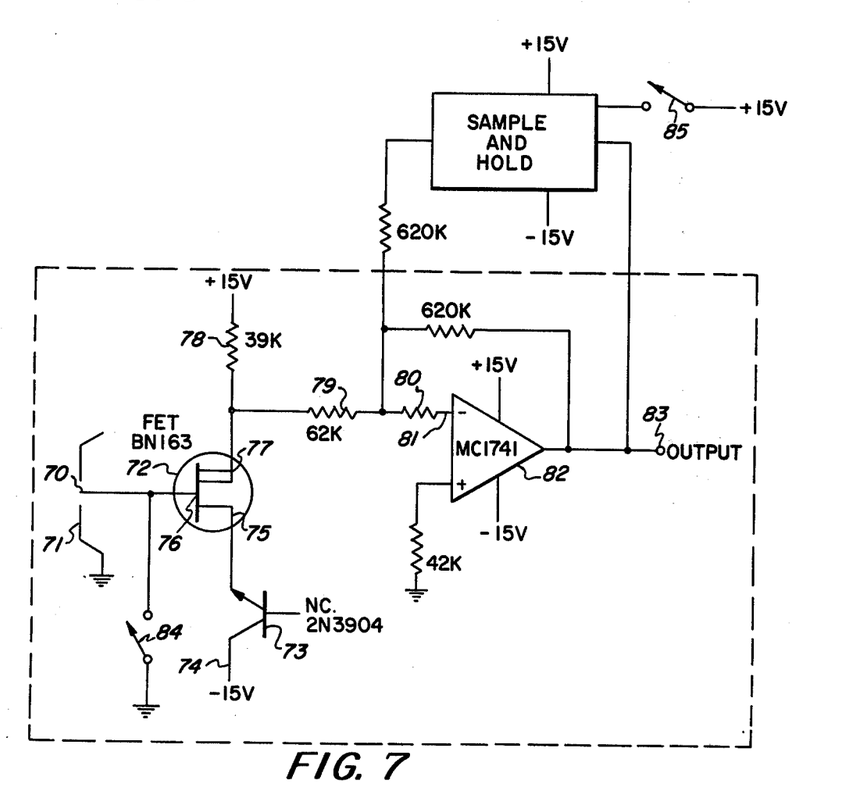

In FIGS. 6 and 7 there are seen examples of the single wire microelectrometer of the instant invention. By way of illustration a 0.0031" diameter central probe 60 with a 0.0100" diameter insulator in a brass housing 61 as shown in FIG. 6. The outer coaxial shield 62 as seen in copper. The insulator 63 is Teflon, polytetrafluoroethylene, or fluorinated ethylene-propylene resins and the center probe "a" is silver-plated, copper-clad steel. The assembly 60, 62 and 63 is supplied by Uniform Tube, Inc. as model UT-13. The assembly is soft soldered into the brass housing 61 to form a probe. Brass is selected for its ability to be soldered, machined and polished. The ground plane remains flat for at least six insulator diameters before curving upward. The bottom is flat to 0.0001" rounded and polished to preclude high voltage arcing and air breakdown between the ground plane and photoreceptor or photoreceptor substrate.

The single probe electrometer circuit which employs the single wire electrometer of Example I is more specifically seen in FIG. 7. The shield 71 around the probe 70 which is identical to the brass housing 61 in FIG. 6 is grounded while the center wire "a" connects to the gate of the 3N163 FET 72. This particular FET is a P-channel enhancement-type silicon metal-oxide semiconductor (MOS) field-effect transistor (FET). Although any suitable FET could be employed in this application this particular one was preferably selected because of its high input resistance i.e., greater than $10^{15}$ ohms; a low gate-to-body leakage, 10pA; no Zener diode protecting the gate and it is available as an MRA, a specific type chip from Siliconix, Inc. The 2N3904 transistor 73 connected from the 15 volt supply 74 to the FET drain 75 acts as a 7.73 volt Zener diode which effectively allows the operating range of this FET to differ from the remainder of the circuit. When a signal is applied to the gate 76 the FET current flows from the FET source 77 to drain 75 through the 39K ohm source resistor 78. This raises or lowers the potential at the source 77 and a current flows through the 62K ohm resistor 79 and the 300K ohm resistor 80. The signal at the negative input 81 of amplifier 82 moves inversely proportional to the signal on the probe 70. The portion of the circuit described to this point is capable of detecting signals but a leakage from the FET source 77 to gate 76 builds up charge on the gate 76 which appears as a zero drift at the output 83. The remainder of the circuitry in FIG. 7 compensates for the zero offset due to drift.

The automatic zeroing circuitry in FIG. 7 has three steps of operation. First the FET gate 76 must be grounded to eliminate residual charge by closing the relay switch 84. Next, the probe is placed over the latent image in an area of known voltage with switch 85 closed. Then 84 is opened and about 0.4 seconds later 85 is opened. This operation removes charge from the gate 76 of FET 72 and then drives the output 83 of amplifier 82 to zero with the sample and hold circuit designated as II. The remaining resistance and applied voltages illustrated are as shown.

Dark decay, an inherent discharge of the selenium photoreceptor during the scan appears at the output as drift and is not compensated by the circuits in FIG. 7.

Since dark decay plus drift is linear for short scan times it can be compensated by providing a second zero reference on the latent image at the end of each scan. Thus the first zero reached is zero, the second is the dark decay plus drift at the end of the scan and the zero anytime during the scan can be linearly interpolated. With this information the signal can be processed to exhibit a signal which truly reflects the magnitude of the latent image.

The scanning electrometer circuit in FIG. 7 was combined with a probe in FIG. 6 to scan xeroradiographic selenium photoreceptor which resulted in the parameters given in Table 1 shown below.

| SCANNING ELECTROMETER PARAMETERS LIST | | |
|---|---|---|
| PARAMETER | VALUE | VALUE |
| | 3/10 probe | 2/4.5 probe |
| Probe/insulator diameters | 79/254μ | 51/114μ |
| Effective diameter | 175μ | 85μ |
| Cap set distance | 45 ± 5μ | 25 ± 5μ |
| Cap variation during scan | 7μ | 7μ |
| Scan speed | 25 ± 3 mm/sec | 25 ± 3mm/sec |
| Photoreceptor thickness | 300 ± 50 volts | 300 ± 3μ |
| Initial photoreceptor voltage, $V_o$ | +3500 ± 50 volts | +3500 ± 50 volts |
| Back bias, $V_B$ | −3500 ± 1 volts | −3500 ± 1 volts |
| Drift (mean) | 1.67 plate volts/second | |
| Dark decay (mean) | −4.19 plate volts/second | |
| Noise RMS (mean) | 1.016 plate volts RMS | 1.392 plate volts RMS |
| Amplifier Gain | 7× | 10× |
| Probe leakage time constant | 24 minutes | 15.3 minutes |

The initial data was taken with a probe diameter of 0.0031" referred to as the 3/10 probe. A 2/4.5 probe was also tested as indicated in Table I. The 2/4.5 probe gave a smaller signal response but higher resolution as expected.

Preprocessing involves modifying the signal by a mathematical function to compress the data in such a way that linear increments of the same size have equal significance with respect to the signal-to-noise ratio. This minimizes the number of bits required with respect to the information when it is desired to digitize the signal. Such a data compression function could be a square root or logarithmic amplifier. If the signal is digitized, the preprocessing function could be done digitally after digitization but before storage, processing and display. Similar benefits can be obtained from digital or analog preprocessing, however, analog processing is less expensive but less accurate. The sample and hold function 50 (S/H) of FIG. 5, and analog-to-digital conversion 51 (A/D) are conventionally employed modules. The S/H 50 fixes the signal when a command is issued and the A/D 51 converts it to n bits of binary code. For example if n=10 this results in 1024 levels of coding. The number of bits may vary with the system but n=6 to 16 is normally the range employed. It may be possible to eliminate the S/H in a digital system if the A/D is fast enough. A purely analog system would not require either function. Multiplexing is done between the amplifier 43 and A/D conversion 51 then switching transients are still present but less of a problem. If multiplexing is done after A/D 51 conversion then the noise introduced by multiplexing can be eliminated by n number of bits times as many multiplexors 48 as are needed. The cost, speed and accuracy are parameters to be considered for each systems design.

After these functions are performed it is necessary to temporarily store the signal before interfacing with the next stage of the overall system. This may be done with a digital buffer memory charge coupled device, scan converter or other suitable storage media.

To further define the specifics of the present invention, the following example is intended to illustrate and not limit the particulars of the present system. Parts and percentages are by weight unless otherwise indicated.

EXAMPLE 1. A single probe microelectrometer system is provided which measures a charge distribution residing on a charge bearing surface. A fifty micron gap is maintained between the charge bearing surface and a probe comprising a copper wire of 0.0031" diameter inside an epoxy insulator applied to the wire to result in about an outside diameter of 0.0040" having a stainless steel guard which is grounded. The probe and ground captures the charge by scanning the surface of the selenium photoreceptor. A 3N163 field effect transistor, having an input resistance of greater than $10^{15}$ ohms, and a 2N3904 amplifier are operatively associated with said capture device in order to amplify and transmit same to an oscilloscope for read-out.

Although the operating conditions depicted were specific in their terms, it should be noted that any suitable set of operating parameters employed in accordance with the teachings of the instant invention may be applied to the system of the instant invention as is hereinafter explained. Any suitable gap may be employed in the system of the instant invention although generally speaking it is found that gaps between 10 microns to 200 microns provide satisfactory results. Below about 10 microns it is expected that air gap breakdown will occur while above 200 microns resolution and sensitivity are substantially deteriorated.

Any suitable diameter wire may be employed as the single wire microelectrometer of the instant invention. Preferably a diameter of about 0.002–0.004" is found to more nearly meet the requirements of the instant invention. In like manner any suitable guard shield diameter may be employed in the system of the instant invention, however, preferably it is found that a diameter of 0.004–0.010" more nearly meets the requirements of the instant invention.

Any suitable conductive material may comprise the microelectrometer wire of the instant invention. Typical conductive materials include silver, copper, copper-clad steel and silver-plated steel among others. The guard may be constructed of any suitable conductive material including metals and the like and preferably stainless steel because of its hardness and abrasion resistant properties.

Any suitable FET may be employed in the system of the instant invention. Typical such FETs should have high input resistances greater than about $10^{15}$ ohms. Any suitable amplifier may be employed in the system of the instant invention. Typical such amplifiers will not exhibit low gain which will result in low or unacceptable sensitivity nor will they exhibit high gain which will result in the production of undesirable noise.

Although the impedances in the various circuits of the embodiments of the instant invention were specific in their recitation, any suitable combination of impedances may be employed according to the charge pattern measured as recited in the teachings of the instant invention.

Although the present example and illustrations were specific in terms of conditions and materials used, any of the above listed typical materials may be substituted when suitable in the above example and illustrations with similar results. In addition to the steps used to carry out the system of the present invention, other steps or modifications may be used if desirable. In addition, other materials may be incorporated in the system of the present invention which will enhance, synergize, or otherwise desirably affect the properties of the systems for their present use.

Anyone skilled in the art will have other modifications occur to him based on the teachings of the present invention. These modifications are intended to be encompassed within the scope of this invention.

What is claimed is:

1. An improved imaging process comprising providing a charge pattern image bearing surface, said image bearing surface comprising a planar shaped photoreceptor, uniformly charging said surface, exposing said surface to penetrating radiation which selectively passes through an object to be analyzed resulting in the formation of a latent electrostatic charge pattern formed in two dimensions, capturing said charge pattern by measuring the magnitude of the charge at points on the image surface by scanning said surface in a two-dimensional, non-rotational manner with a single wire microelectrometer to provide an analog electrical signal in conformity with said charge image pattern, said microelectrometer being moved past said surface, and coupling said electrical signal to a signal processor wherein said electrical signal is processed in a predetermined manner and displayed.

2. The imaging process as defined in claim 1 wherein said analog electrical signal is converted into a compressed digital signal and wherein said compressed digital signal is stored prior to being coupled to said signal processor.

3. The process as defined in claim 1 wherein said process comprises a xeroradiographic medical diagnostic imaging process.

4. An improved apparatus comprising charging means, an image member which is uniformly charged by said charging means, said image member comprising a planar shaped photoreceptor, a source of radiation which exposes said charged image member through an object to be analyzed thereby resulting in an electrostatic charge pattern formed in two dimensions on the surface of said image member, means for capturing said latent electrostatic image comprising means for detecting the magnitude of the charge across the image pattern by scanning said surface in a two-dimensional, non-rotational manner utilizing a single wire electrometer, thereby converting said image pattern to an analog electrical signal in conformance with said charge pattern, means for moving said microelectrometer past said surface, and means for coupling said electrical signal to a signal processor wherein said electrical signal is processed in a predetermined manner and displayed.

5. The apparatus as defined in claim 4 further comprising means for converting said analog electrical signal into a compressed digital signal and means for storing said compressed digital signal prior to being coupled to said signal processor.

6. The apparatus as defined in claim 4 wherein said apparatus comprises xeroradiographic medical diagnostic apparatus.

7. An improved imaging process comprising providing a charge pattern image bearing surface, said image bearing surface comprising a planar shaped photoreceptor, uniformly charging said surface, applying an exposure to said surface of penetrating radiation which passes through an object to be analyzed resulting in the formation of a latent electrostatic charge pattern formed in two dimensions, capturing said charge pattern by measuring the magnitude of charge at points on the image surface by scanning said surface in a two-dimensional, non-rotational manner with a single wire electrometer to provide an analog electrical signal in conformity with said charge pattern, said microelectrometer being moved past said surface, coupling said electrical signal to a signal processor and processing said signal in a predetermined manner and displaying said processed signal.

8. The process as defined in claim 7 wherein said analog electrical signal is converted into a compressed digital signal and wherein said compressed digital signal is stored prior to being coupled to said signal processor.

9. The imaging process as defined in claim 7 wherein said process comprises a xeroradiographic medical diagnostic imaging process.

* * * * *